United States Patent [19]
Holtvoeth

[11] Patent Number: 5,854,973
[45] Date of Patent: Dec. 29, 1998

[54] RADIO RECEIVERS

[75] Inventor: Knud Holtvoeth, Hamburg, Germany

[73] Assignee: U.S. Philips Corporation, New York, N.Y.

[21] Appl. No.: 810,901

[22] Filed: Mar. 5, 1997

[30] Foreign Application Priority Data

Mar. 6, 1996 [EP] European Pat. Off. ............ 96301543

[51] Int. Cl.$^6$ .................................................. H04B 1/06
[52] U.S. Cl. .................................. 455/245.1; 455/250.1; 455/234.1
[58] Field of Search ...................... 455/136, 138, 455/139, 141, 146, 209, 219, 233.1, 240, 241.1, 245.1, 245.2, 248.1, 250.1, 249.1, 253.1; 330/139, 252, 285; 327/308, 318

[56] References Cited

U.S. PATENT DOCUMENTS

| | | |
|---|---|---|
| 4,812,908 | 3/1989 | Frequin .................................. 348/678 |
| 4,885,802 | 12/1989 | Ragan ..................................... 455/344 |
| 5,263,194 | 11/1993 | Ragan ..................................... 455/316 |
| 5,448,756 | 9/1995 | Deluca et al. ......................... 455/38.3 |
| 5,513,387 | 4/1996 | Saito et al. ............................ 455/243.1 |

*Primary Examiner*—Wellington Chin
*Assistant Examiner*—Isaak R. Jama
*Attorney, Agent, or Firm*—Jack D. Slobod

[57] ABSTRACT

A receiver including an rf amplifier(14) having an input, an output and a gain control input(38), for deriving a gain control signal. A gain control (36) responsive to the gain control signal. The gain control (36) comprises at least 2 parallel arranged bias currents (40,42,44), at least one(42 or 44) of the 2 bias current means including switching means (SW1 or SW2) responsive to a control voltage varying by a predetermined amount relative to a reference voltage($V_{ref1}$ or $V_{ref2}$) for actuating the switching means(SW1 or SW2) to connect or disconnect the bias current (42 or 44) to or from the gain control input.

6 Claims, 3 Drawing Sheets

RADIO RECEIVERS

BACKGROUND OF THE INVENTION

The present invention relates to improvements in or relating to radio receivers and in particular to the stepwise power output control of an rf amplifier.

For applications such as digital paging there is a desire to make the pagers physically small and with such a target in mind the radio receivers and decoders have been made as integrated circuits with as few as possible off-chip components. Currently produced integrated receivers such as the Philips Semiconductors UAA2080T operate at a typical voltage of 2.05 volts with a maximum of 3.5 volts and a minimum of 1.9 volts which requires the pager to contain 2 batteries which occupy a relatively large space. Accordingly if the operating voltage can be reduced so that only a single cell is necessary then a useful saving in space can be achieved.

Another aspect about radio circuits especially when incorporated into a mobile apparatus, such as a pager, is that the strength of the received signal will vary firstly in dependence on the distance from the transmitting signal antenna to the receiver and secondly due to topographical features such as hills, high rise buildings and large vehicles temporarily blocking the direct signal path to the receiver. A consequence of this is that unless measures are taken the rf amplifier in the receiver which has sufficient gain to amplify weak signals satisfactorily will over amplify strong signals which will produce problems in the frequency down conversion mixer or mixers which follow the rf amplifier.

A known method of controlling the gain of the rf amplifier is to connect a PIN diode to the signal input circuit of the rf amplifier and attenuating the input signal by varying the bias current applied to the PIN diode. The bias current may be varied in response to an automatic gain control signal derived from a signal strength measuring stage incorporated into the receiver. A condition imposed on the gain control signal is that any interfering signals have to be suppressed by at least 40 dB with respect to the gain of the rf amplifier. Drawbacks to using PIN diode attenuators are that varying their conductivity does affect the tuned circuits associated with the receiver's input stage and until recently they have been current hungry devices which mitigates against battery conservation.

OBJECTS AND SUMMARY OF THE INVENTION

An object of the present invention is to be able to adjust the gain of an rf amplifier in a radio receiver operating at a low voltage whilst ensuring that an interfering signal is suppressed by at least 40 dB.

According to the present invention there is provided a receiver including an rf amplifier having an input, an output and a gain control input, and gain control means for applying a gain setting signal to said gain control input, the gain control means comprising at least 2 parallel arranged bias current means, at least one of said at least 2 bias current means including switching means responsive to a control signal varying by at least a predetermined amount relative to a reference signal for actuating the switching means to connect or disconnect the bias current means to or from the gain control input.

In the receiver made in accordance with the present invention, each of the bias current means comprises at least one junction transistor having an emitter, the area of said emitter being dimensioned to pass a respective predetermined current. The relative sizes of the emitter areas may correspond to predetermined gain reduction steps. Altering the gain using current control of the rf amplifier has a number of advantages over using a PIN diode namely, that battery current is conserved and that the tuning of the input circuits is unaffected by the gain variations. Additionally by setting the gain steps using transistors having predetermined emitter areas the same gain reductions in dB are always obtained independently of the frequency of the input signal and reference current.

Optionally, when operating the receiver at about 1.0 volts it may not be possible to achieve the full range of attenuation steps and further attenuation steps may be obtained using a PIN diode.

BRIEF DESCRIPTION OF THE DRAWINGS

The present invention will now be described, by way of example, with reference to the accompanying drawings, wherein.

In the drawings the same reference numerals have been used to indicate corresponding features.

DETAILED DESCRIPTION OF THE PREFERRED EMBODIMENT

Figure 1:
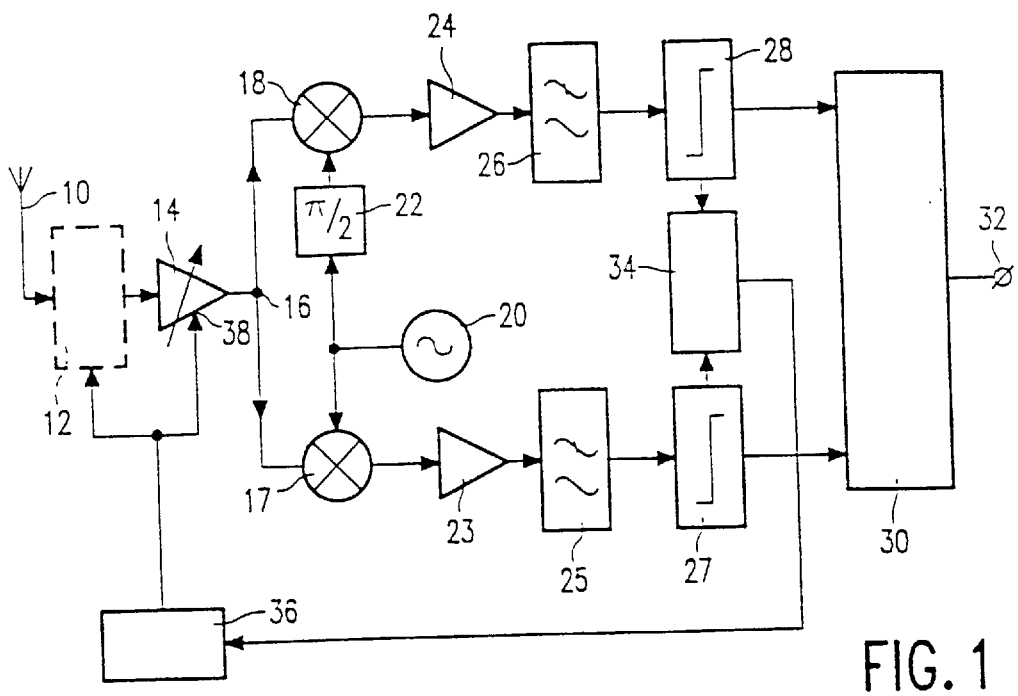
FIG. 1 is a block schematic diagram of a zero IF radio receiver made in accordance with the present invention.

The zero IF radio receiver shown in FIG. 1 comprises an antenna 10 which is coupled to a rf amplifier 14, the gain of which is adjustable in steps. Optionally a PIN diode attenuator 12 may be coupled between the antenna 10 and the rf amplifier 14. The output of the rf amplifier 14 is coupled to a signal dividing node 16 to which are connected first inputs of mixers 17, 18. A local oscillator 20 having a frequency corresponding substantially to the notional carrier frequency of the wanted signal received at the antenna 10 is coupled to a second input of the mixer 17 and, by way of a 90 degree phase shifter 22, to a second input of the mixer 18. The outputs of the mixers 17, 18, which are in phase quadrature, are applied to respective post-mixer amplifiers 23, 24. Low pass filters 25, 26 select the difference signal from the products of mixing present at the respective outputs of the amplifiers 23, 24. Limiting amplifiers 27, 28 have inputs coupled to outputs of the low pass filters 25, 26, respectively, and outputs coupled to a demodulator 30 which has an output 32.

An agc circuit 34 is coupled to the limiting amplifiers 27, 28. The agc circuit 34 provides an output signal indicative of the amplitude of the received signal. An output of the agc circuit 34 is connected to a circuit 36 for generating gain control signals which are applied to a control input 38 of the rf amplifier 14 and optionally to the PIN diode attenuator 12. The gain of the rf amplifier 14 is adjusted in steps by changing the bias control current applied to the control input 38.

Figure 2:
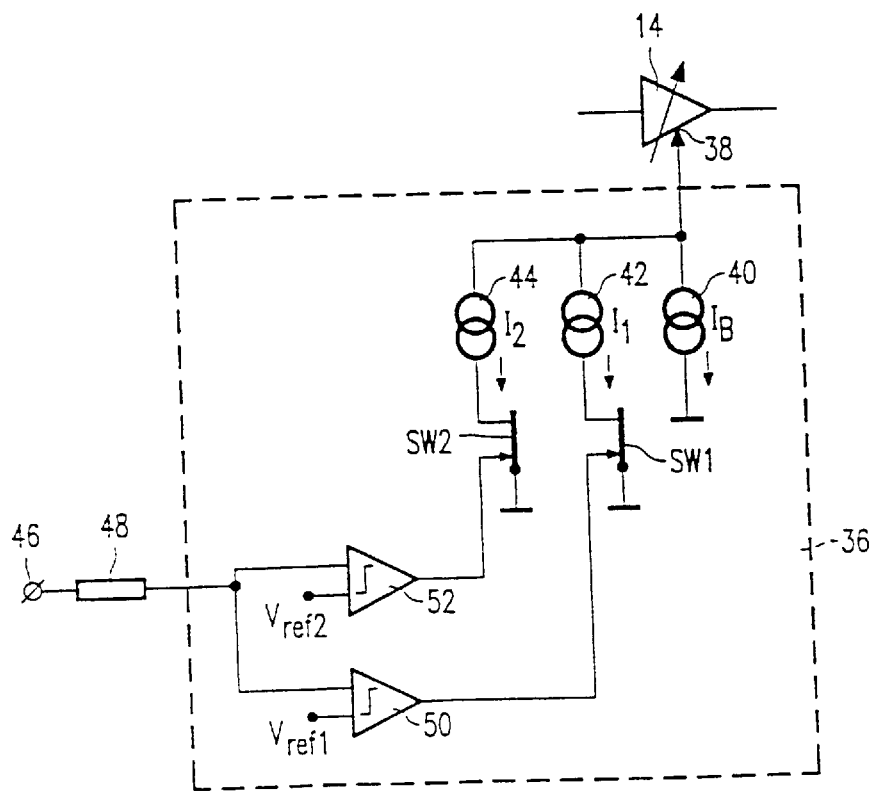
FIG. 2 is a block schematic block diagram of the stepped current gain controller.
Figure 3:
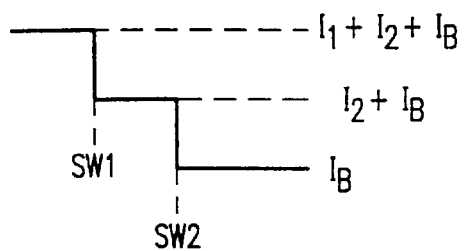
FIG. 3 is a waveform diagram indicating the bias current levels achieved by the gain controller shown in FIG. 2.

Referring to FIGS. 2 and 3, in order to provide a control current which is substantially free of interfering signals, three current sources 40, 42 and 44 are provided to produce currents $I_B$, $I_1$ and $I_2$, respectively.

The current source 40 is permanently connected to the control input 38 whereas the sources 42, 44 are connected to the control input 38 by way of switches SW1 and SW2.

In FIG. 2, the agc current from the agc circuit 34 (FIG. 1) is coupled to an input 46 to which is connected a resistor 48 which converts the agc current into a voltage which is applied to first inputs of respective comparator circuits 50, 52. Reference or threshold voltages $V_{ref1}$ and $V_{ref2}$ are applied to second inputs of the comparator circuits 50, 52. When the voltage on the first input exceeds the voltage on the second input then a signal is produced closing the respective switch, that is making it conductive. However if the converse occurs the respective switch is opened, that is making it non-conductive.

Thus, as shown in FIG. 3, if the input signal received at the antenna 10 (FIG. 1) is of low amplitude requiring the gain of the rf amplifier to be increased, then the agc voltage is high causing both comparators to produce output signals closing the switches SW1 and SW2 with the result that the amplifier control current is the sum of $I_1+I_2+I_B$. If the antenna signal is stronger requiring less rf gain, then assuming that the voltage applied to the comparator is greater than $V_{ref2}$ but lower than $V_{ref1}$, the switch SW1 is opened so that the control current is the sum of $I_2+I_B$. Lastly in the situation where the antenna signal is sufficiently strong that both switches SW1 and SW2 are opened then only the bias current $I_B$ is applied to the rf amplifier. Controlling the gain in this manner avoids generating unnecessary interference, saves current by reducing the amplifier gain when strong signals are present which in turn avoids overloading the mixers 17, 18 (FIG. 1). The current sources 40, 42, 44 may comprise transistors having different emitter areas which define unambiguously the relative size of a step independently of the actual current supplied.

Figure 4:
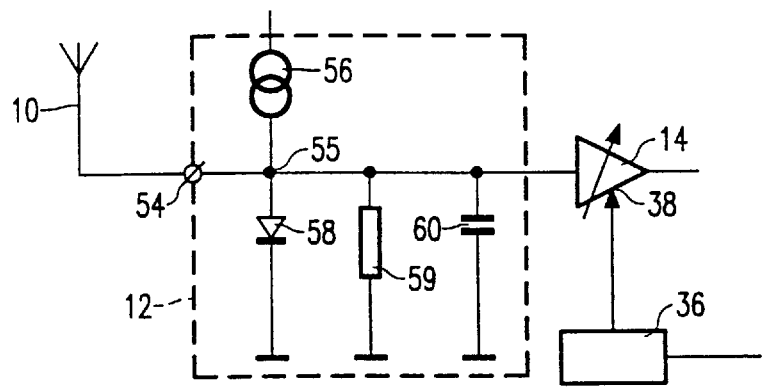
FIG. 4 is a schematic circuit diagram of a PIN diode circuit for producing additional gain steps.

In the event of more gain steps being required than is possible by adjusting the gain of the rf amplifier 38, then a PIN diode circuit 12 can be used to provide attenuation of the signal applied to the rf amplifier 38. FIG. 4 illustrates an embodiment of the PIN diode circuit 12 which comprises an input 54 to which a junction 55 of a series connected a current source 56 and a PIN diode 58 is connected. The junction 55 is coupled to the input of the rf amplifier 38. Shunt resistive element(s) 59 and capacitive element(s) 60 filter the received signal prior to it being applied to the rf amplifier 38.

Figure 5:
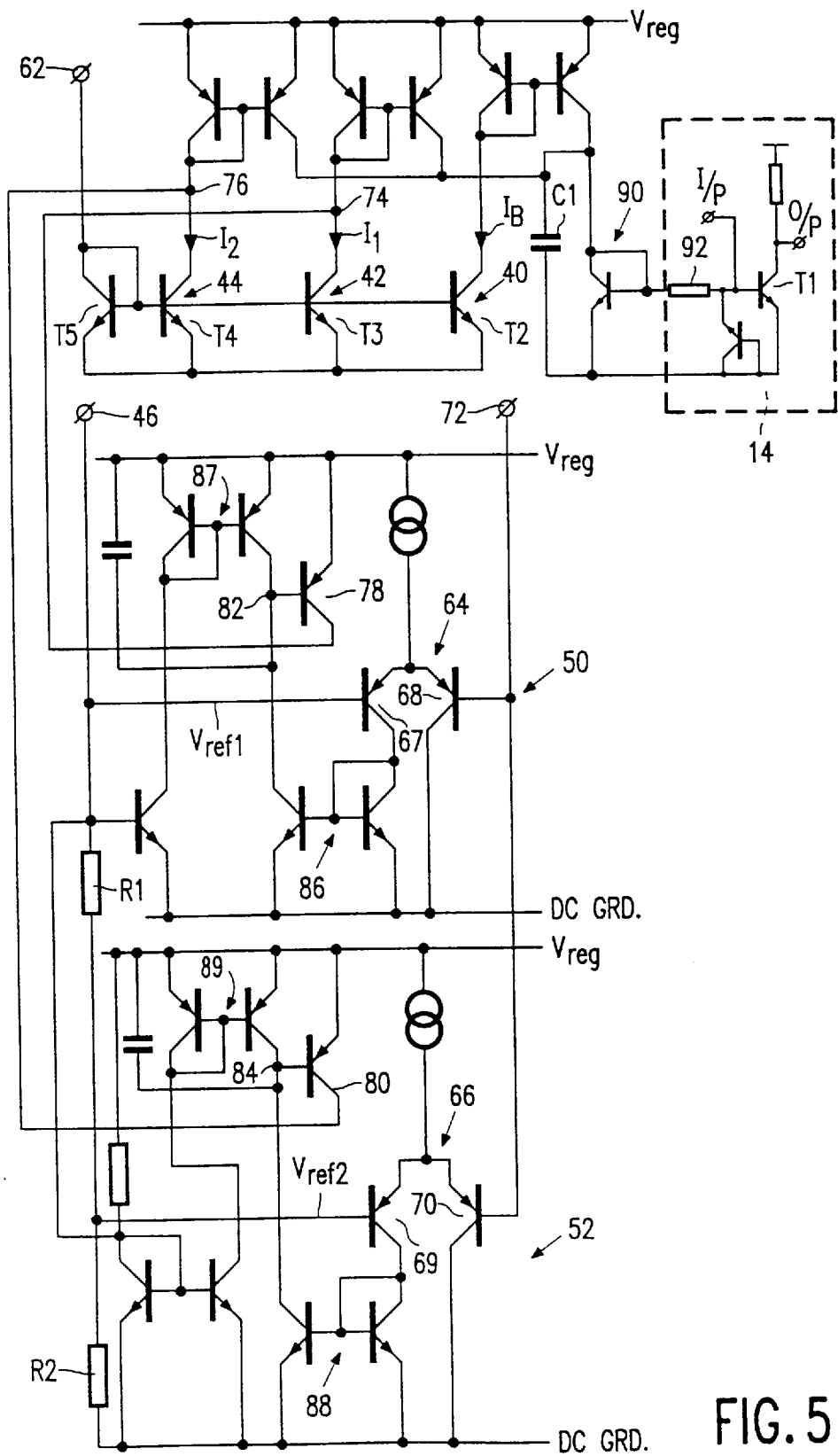
FIG. 5 is a simplified schematic circuit diagram of a r.f. amplifier and gain control circuitry.

FIG. 5 is a simplified schematic circuit diagram of an embodiment of the rf amplifier 14 and the circuit 36. The rf amplifier 14 comprises NPN transistor T1. An input signal derived from the antenna 10 (FIG. 1) is applied to its base electrode. An output signal is derived from its collector circuit. The current sources 40, 42, 44 comprise NPN transistors T2, T3, T4, respectively, whose emitter areas are predetermined to provide the desired step sizes in the control currents. By way of example the ratio of the emitter areas is 1.417:1.000:1.208. The currents are supplied by way of external reference current source (not shown) connected to an input 62 which is coupled to a diode connected transistor T5 having a relative emitter area 1.942. The current in the transistor T5 is mirrored to the transistors T2, T3, T4. Irrespective of the value of the current supplied to the terminal 62, the ratio of the currents which can be supplied remains the same.

The comparator circuits 50, 52 together with the switches SW1 and SW2 are implemented as long tailed pair circuits 64, 66 in FIG. 5. Each long tail pair circuit comprises pairs of NPN transistors 67, 68 and 69, 70. The reference voltages $V_{ref1}$ and $V_{ref2}$ which are applied to the base electrodes of the transistors 67, 69, are respectively, derived from a potentiometer consisting of series connected resistors R1, R2 connected between an input terminal 46 and ground. The agc voltage is applied to the base electrodes of the transistors 68, 70 by way of an input terminal 72.

The collector circuits of the transistors T3, T4 are coupled by way of respective junctions 74, 76 to the collector circuits of PNP transistors 78, 80, the base electrodes of which are connected to a junction 82, 84 of pairs of current mirror circuits 86, 87 and 88, 89, respectively. The circuits 86, 88 mirror the current in the collector circuits of the transistors 67, 69 to the current mirrors 87, 89, respectively.

In operation when the agc voltage is high, both switching circuits are in a condition that the currents $I_1$, $I_2$ and $I_B$ are summed and applied to the base circuit of the transistor T1 by way of a current mirror circuit 90 and a resistor 92. If the agc voltage falls to a level such that the voltage of the base electrode of the transistor 68 is lower than that of the base electrode of the transistor 67, the latter becomes conductive. The current at the junction 82 increases such that the transistor 78 becomes conductive causing the transistor T3 to become non-conductive thereby switching off the current source 42. The sum of the currents $I_B+I_2$ continues to be supplied as the gain control current to the transistor T1.

If the agc voltage decreases to a point that the transistor 69 becomes conductive and the transistor 70 non-conductive. The current at the junction 84 increases causing the transistor 80 to become conductive and the transistor T4 to become non-conductive thereby switching off the current source 44. The bias current $I_B$ continues to be supplied as the gain control current to the transistor T1.

If the agc voltage increases from its minimum level then the current sources 44 and 42 are switched on again to produce steplike increases in the gain control current.

A capacitor C1 is coupled between the current summing line and rf ground to provide circuit stability for base current compensation and noise reduction.

From reading the present disclosure, other modifications will be apparent to persons skilled in the art. Such modifications may involve other features which are already known in the design, manufacture and use of radio receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A receiver including an rf amplifier having an input, an output and a gain control input, and gain control means for applying a gain setting signal to said gain control input, the gain control means comprising at least 2 parallel arranged bias current means, at least one of said at least 2 bias current means including switching means responsive to a control signal varying by at least a predetermined amount relative to a reference signal for actuating the switching means to connect or disconnect the bias current means to or from the gain control input.

2. A receiver as claimed in claim 1, characterised in that the at least 2 bias current means each comprise at least one transistor, the emitter area of each transistor being dimensioned to pass a respective predetermined current.

3. A receiver as claimed in claim 2, characterised in that the relative sizes of the emitter areas correspond to predetermined gain reduction steps.

4. A receiver as claimed in claim 1, characterised in that the other of said at least two bias current means is connected to said gain control input to provide a minimum bias current as a minimum gain setting signal.

5. A receiver as claimed in claim 1, further comprising input signal attenuating means coupled to the signal input.

6. A receiver as claimed in claim 5, characterised in that said attenuating means comprises a PIN diode and a bias current source controllable by the gain control means.

* * * * *